(12) United States Patent
Lee et al.

(10) Patent No.: US 7,621,039 B2
(45) Date of Patent: Nov. 24, 2009

(54) COMPONENT MOUNTING APPARATUS WITH PIVOTABLE TRANSFER MECHANISM

(75) Inventors: Tae-young Lee, Seongnam-si (KR); Young-soo Hwang, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 390 days.

(21) Appl. No.: 11/174,167

(22) Filed: Jul. 1, 2005

(65) Prior Publication Data
US 2006/0182585 A1 Aug. 17, 2006

(30) Foreign Application Priority Data
Jan. 14, 2005 (KR) .................. 10-2005-0003752

(51) Int. Cl.
*H05K 3/30* (2006.01)
(52) U.S. Cl. .............. 29/740; 29/741; 29/743; 198/346.1; 414/752.1
(58) Field of Classification Search ........... 29/740–743, 29/759, 834; 198/346.1, 465.1; 414/222, 414/752.1
See application file for complete search history.

(56) References Cited

U.S. PATENT DOCUMENTS 5,172,468 A * 12/1992 Tanaka et al. .............. 29/721
6,216,341 B1 * 4/2001 Nakahara .................. 29/833
6,266,873 B1 * 7/2001 Kitamura et al. ........... 29/832
6,374,484 B1 * 4/2002 Yoshida et al. ............ 29/740
6,519,838 B1 * 2/2003 Okuda et al. .............. 29/740
6,526,651 B1 * 3/2003 Hwang .................... 29/740
6,634,091 B1 * 10/2003 Hwang et al. ............. 29/720
6,729,017 B1 * 5/2004 Kashiwagi et al. ......... 29/740

FOREIGN PATENT DOCUMENTS

KR 1998-070627 A 10/1998

* cited by examiner

*Primary Examiner*—Minh Trinh
(74) *Attorney, Agent, or Firm*—Drinker Biddle & Reath LLP

(57) ABSTRACT

Provided is a component mounter. The component mounter comprises: a bed; a component supply unit; a conveyor transferring at least one PCB to a specified mounting position; a plurality of head units having at least one nozzle for picking up the electronic component from the component supply unit and for mounting it to the PCB; first and second Y axis transfer mechanisms; an X axis transfer mechanism having a first end of mounted to the first Y axis transfer mechanism and the second end mounted to the second Y axis transfer mechanism; a first driving unit controlling the movement of the first end of the X axis transfer mechanism along Y axis; and a second driving unit controlling the movement of the second end of the X axis transfer mechanism along the Y axis, independently of the first driving unit.

8 Claims, 5 Drawing Sheets

COMPONENT MOUNTING APPARATUS WITH PIVOTABLE TRANSFER MECHANISM

CROSS-REFERENCE TO RELATED PATENT APPLICATION

This application claims the benefit of Korean Patent Application No. 10-2005-0003752, filed on Jan. 14, 2005, in the Korean Intellectual Property Office, the disclosure of which is incorporated herein in its entirety by reference.

BACKGROUND OF THE INVENTION

1. Field of the Invention

The present invention relates to a method for mounting components and a component mounter adopting the method. More particularly, the present invention relates to a component mounter which comprises a plurality of head units for receiving various kinds of components from a component supply apparatus, transferring them to a mounting position of a printed circuit board (PCB), and mounting them to the PCB.

2. Description of the Related Art

As shown in FIG. 1, a conventional component mounter 1 comprises a head unit 4 having at least one nozzle 5, an X axis transfer mechanism 3, and Y axis mechanisms 2. The nozzle 5 vertically moves to absorb or detach electronic components and mount them to PCB P. The X axis transfer mechanism 3 and the Y axis transfer mechanisms 2 guide the head unit 4 to a predetermined position.

The Y axis transfer mechanisms 2 are arranged parallel at both sides of the bed. The X axis transfer mechanism 3 and a conveyor 6 which carries a printed circuit board ("PCB") are arranged at a right angle direction to the Y axis transfer mechanisms 2. In this case, both ends of the X axis transfer mechanism 3 move in the Y axis direction while keeping a right angle to the Y axis transfer mechanism 2 because they do not perform a relative movement.

Therefore, in order to mount the electronic components, one end and the other end of the X axis transfer mechanism 3, move in the Y axis direction at the same time, and the head units 4 mounted to the X axis transfer mechanism 3 respectively move in the X axis direction, and thus each head unit 4 is positioned on the PCB P corresponding to the head unit 4. Thereafter, the nozzles 5 descend and mount the electronic components to the PCB. In this case, one end and the other end of the X axis transfer mechanism 3 moving in the Y axis direction are in the same position in the Y axis direction. That is, one end and the other end of the X axis transfer mechanism 3 do not perform a relative movement.

A recent component mounter comprises at least two head units 4 having a plurality of nozzles 5. The plurality of nozzles 5 absorb a plurality of electronic components one by one or at the same time, move a plurality of absorbed electronic components from the conveyor 6 at the same time, and mount the moved electronic components to the PCB P one by one or at the same time, thus increasing efficiency in mounting the components. The trend is toward a plurality of PCBs P being supplied to the conveyor 6, depending on the number of head units.

However, in the component mounter 1, there is a positional difference that occurs when the conveyor 6 is not placed parallel to the X axis when assembling the conveyor 6 or when a plurality of PCBs P are not placed parallel to the conveyor 6 when positioning the PCB P to the conveyor 6. Due to such a positional difference, a Y axis position of one head unit 4 is not the same as that of the PCB P corresponding to the head unit 4 when a Y axis position of the other head unit 4 is equally adjusted to that of the PCB P corresponding to the head unit 4.

Thereby, it is impossible to mount multiple electronic components to the PCB by descending, at the same time, nozzles provided to at least two head units on the component mounter.

To solve such a problem, a position of a portion of the conveyor unit in the Y axis direction may be corrected. However, this method increases a material cost due to the increasing number of shafts and position accuracy deteriorates because a position of the head unit and a position of the conveyor should control at the same time.

SUMMARY OF THE INVENTION

Various embodiments of the present invention provide a method of mounting components, and a component mounter adopting the method, in which nozzles respectively arranged to two or more head units can absorb and mount electronic components at the same time without increasing the number of axes.

According to an embodiment of the present invention, there is provided a component mounter comprising: a bed, a conveyor, a plurality of head units, first and second Y axis transfer mechanisms, an X axis transfer mechanism, a first driving unit, and a second driving unit.

A component supply unit may supply electronic components. The conveyor for transferring at least two PCBs to their respective mounting positions may be mounted to the bed. The head units may be provided with at least one nozzle for picking up the electronic component from the component supply unit and mounting the component to the PCB.

The first and second Y axis transfer mechanisms may be mounted in parallel along the Y axis to the bed. The X axis transfer mechanism may be provided with one of its ends mounted to the first Y axis transfer mechanism to move along the Y axis and the other one of its ends mounted to the second Y axis transfer mechanism to move along the Y axis.

The first driving unit may control the movement of one end of the X axis transfer mechanism along the Y axis. The second driving unit may control the movement of the other end of the X axis transfer mechanism along the Y axis independently of the first driving unit.

The second driving unit may be driven by interlocking with the first driving unit so that the X axis transfer mechanism moves along the Y axis while keeping parallel to the X axis. The first driving unit and the second driving unit may drive the first Y axis transfer mechanism and the second Y axis transfer mechanism in a dual servo mode.

The X axis transfer mechanism and the first Y axis transfer mechanism may be coupled by a rotation connection member for its relative rotation in between. The first Y axis transfer mechanism and the second Y axis transfer mechanism may also be coupled in this manner.

A head drive unit for independently moving the head units along the X axis may further be provided. At least two PCBs corresponding one to one with one head unit may be positioned in the conveyor. The second driving unit may move the other end of the X axis transfer mechanism along the Y axis so that a first imaginary line, formed on a plurality of PCBs, connecting mounting points corresponding to specified mounting positions of the electronic components is parallel to a second imaginary line connecting the nozzles that absorb the electronic components to be mounted to the specified mounting positions.

The head units may mount the electronic components at the same time.

The first Y axis transfer mechanism may further include a first ball screw coupled to the first driving unit, wherein the first ball screw rotates depending on the driving of the first driving unit. The first ball screw may be arranged along the Y axis, and a first end of the X axis transfer mechanism may be coupled to the first ball screw. The second Y axis transfer mechanism may further include a second ball screw coupled to the second driving unit, wherein the second ball screw rotates depending on the driving of the second driving unit. The second ball screw may be arranged along the Y axis, and a second end of the X axis transfer mechanism may be coupled to the second ball screw.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
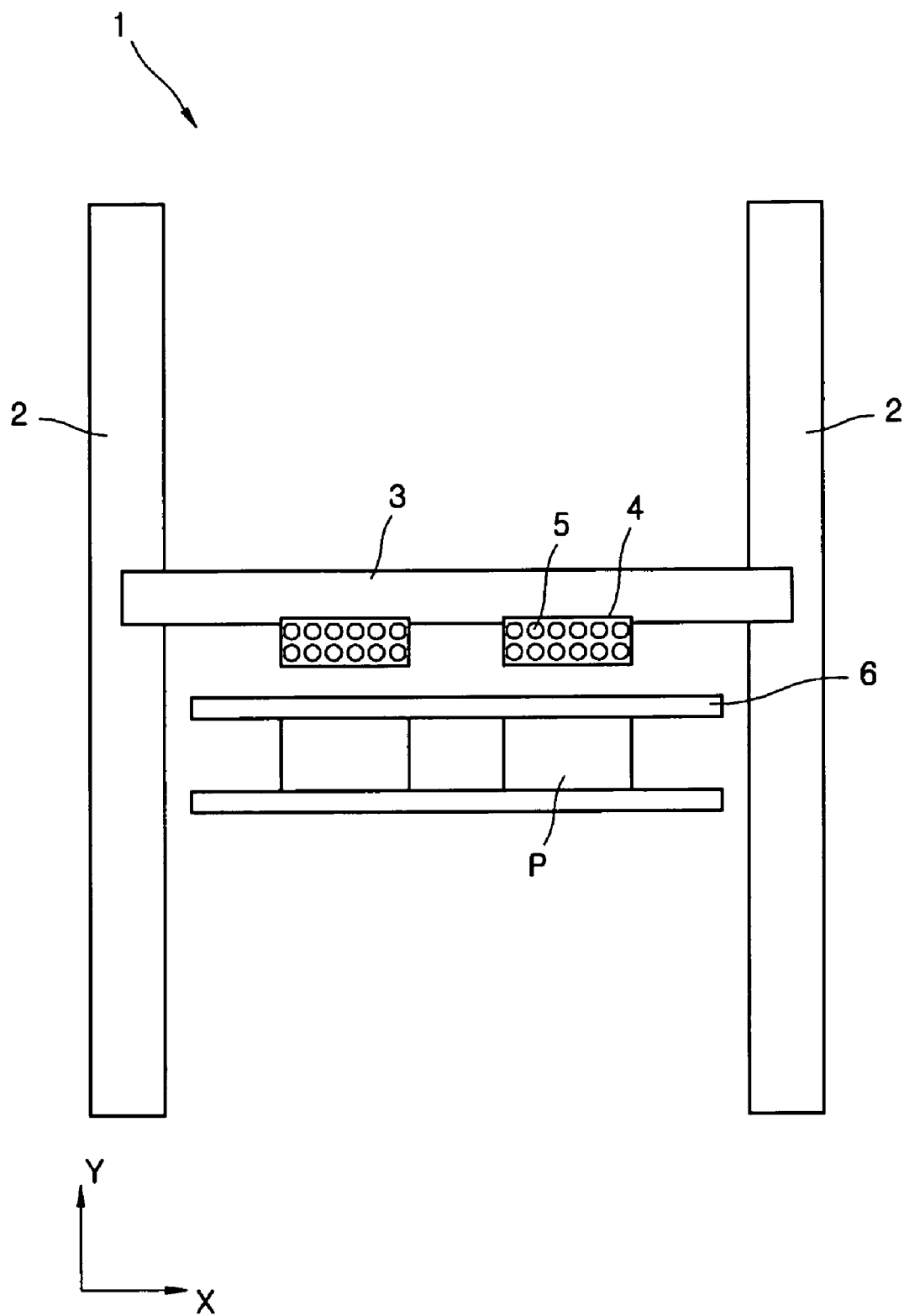
FIG. 1 is a top plan view schematically illustrating a combined structure of a Y axis transfer mechanism and an X axis transfer mechanism according to a conventional component mounter.
Figure 2:
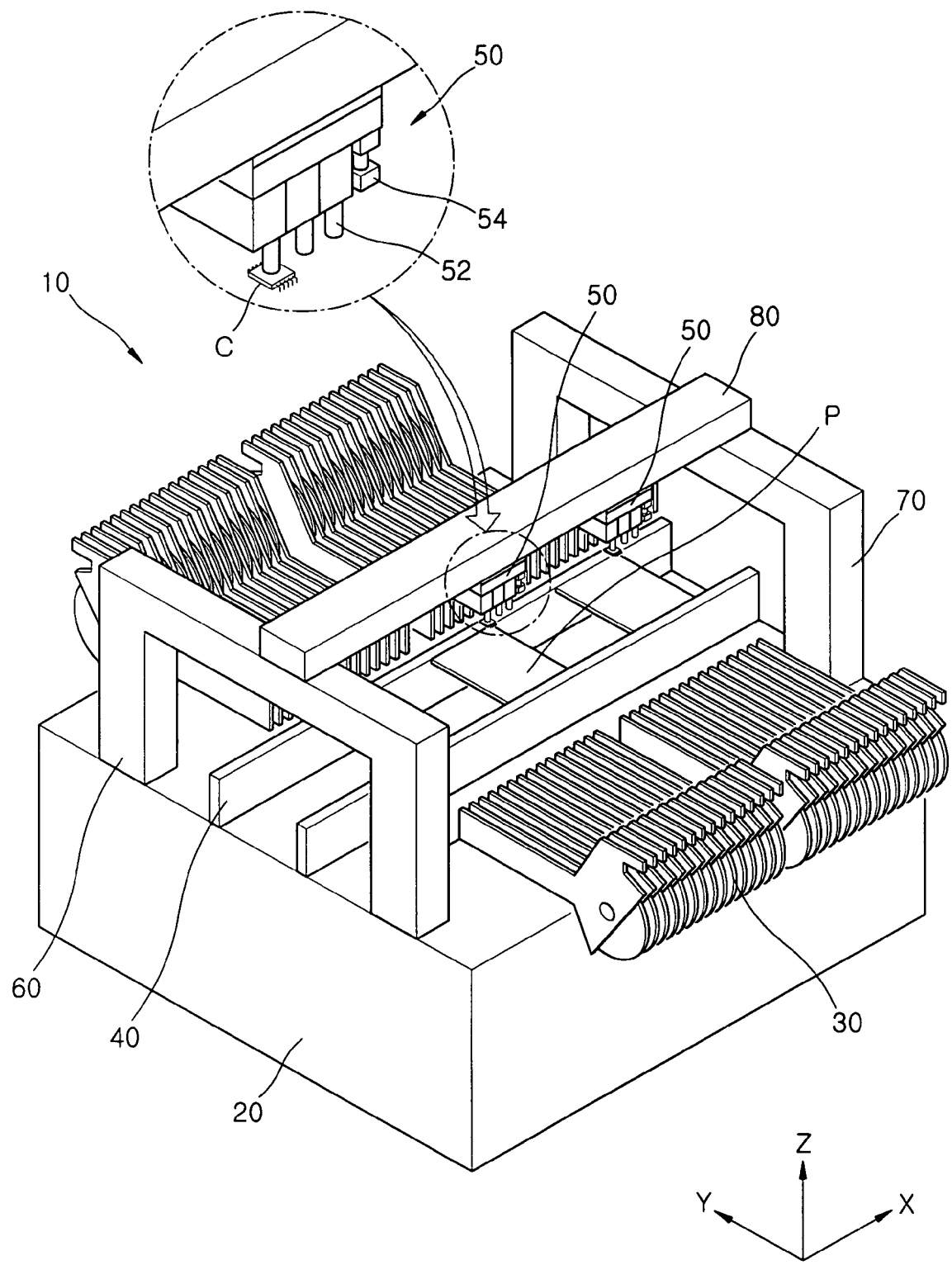
FIG. 2 is a perspective view schematically illustrating a component mounter according to an embodiment of the present invention.
Figure 3:
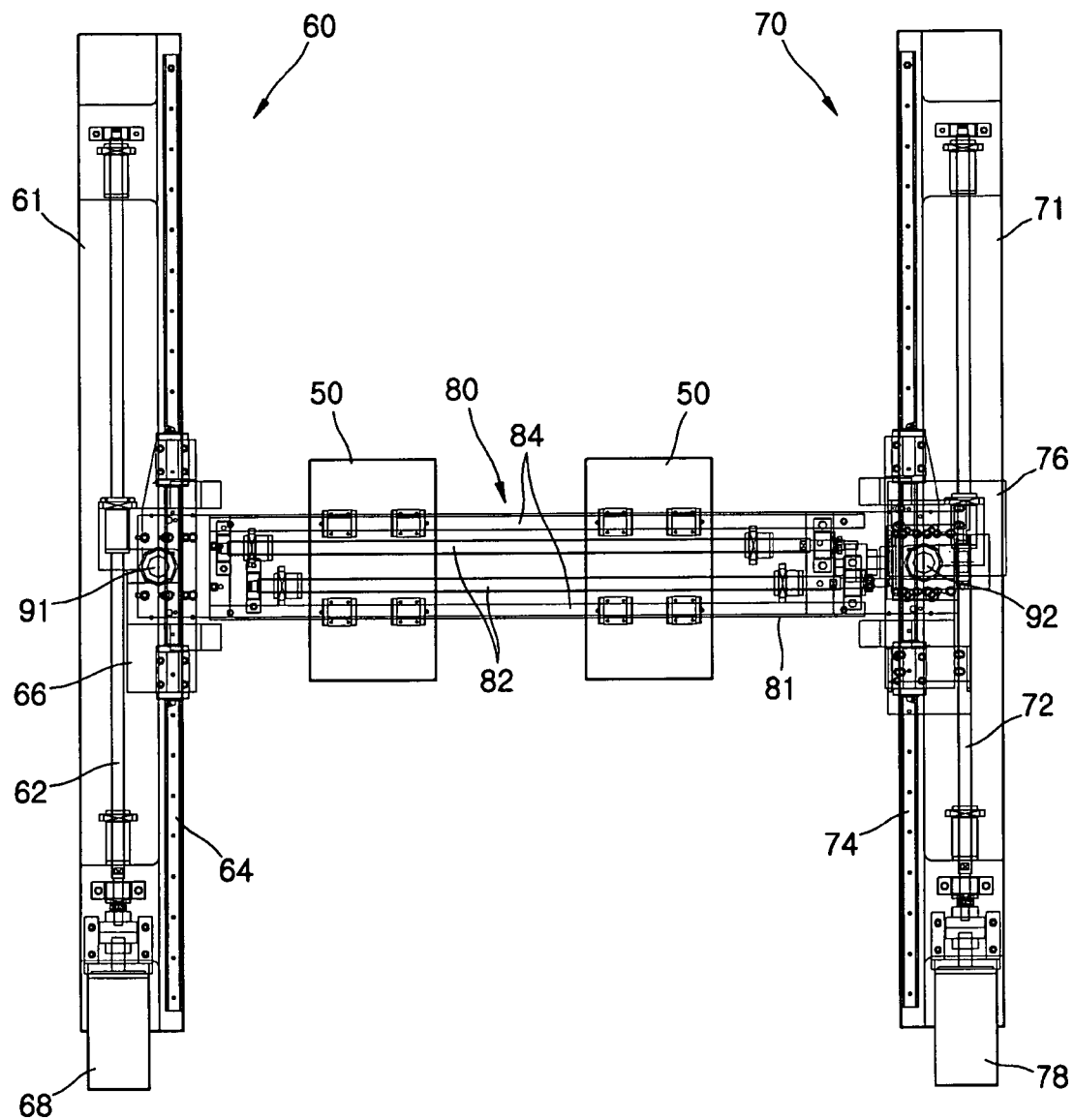
FIG. 3 is a top plan view illustrating an embodiment of the first and second Y axis transfer mechanisms and the X axis transfer mechanism shown in FIG. 2.

Referring to FIGS. 2 and 3 showing a component mounter and transfer mechanisms provided to the component mounter according to an embodiment of the present invention, the component mounter 10 according to an embodiment of the present invention comprises a bed 20, a component supply unit 30, a conveyor 40, at least two head units 50, a first Y axis transfer mechanism 60, a second Y axis transfer mechanism 70, an X axis transfer mechanism 80, a first driving unit 68, and a second driving unit 78.

Electronic components C are supplied by the component supply unit 30 and are mounted to a mounting surface, e.g., a PCB P, that is arranged on the conveyor. The conveyor 40 transfers at least one PCB P to specified mounting positions. In an embodiment, a plurality of PCBs P are transferred to mounting positions and thus allow the electronic components C to mount at the same time to a plurality of PCBs P.

The conveyor 40 may also be mounted to the bed 20.

In an embodiment, the component mounter 10 includes a plurality of head units 50 having at least one nozzle 52 for picking up the electronic components C from the component supply unit 30 and for mounting them to the PCB P. The head unit 50 comprises a Z axis operation mechanism for vertically moving the nozzles 52 and a rotation mechanism (not shown) for rotating the nozzles 52. Therefore, the nozzles 52 may pick up the electronic components C from the component supply unit 30, depending on the operation of the Z shaft operation mechanism, the rotation mechanism, a first and second Y axis transfer mechanism 60, 70, and the X axis transfer mechanism 80 and mount them to the PCB P arranged on the conveyor 40.

A camera 54 may be provided to the head unit 50. The camera 54 is installed such that it does not prevent the nozzles 52 from moving vertically and performs a function of generally photographing a fiducial mark of the PCB P.

The component mounter 10 according to an embodiment of the present invention, as shown in FIG. 3, may comprise the first driving unit 68 for moving a first end of the X axis transfer mechanism 80 along the Y axis and the second driving unit 78 for moving a second end of the X axis transfer mechanism 80 along the Y axis.

Only the first driving unit 68 for moving the first end of the X axis transfer mechanism 80 is driven when it is required to move, in parallel, the first end and the second end of the X axis transfer mechanism 80. Thus, both the first end and the second end of the X axis transfer mechanism may be moved depending on the driving of the first driving unit 68. Further, the second driving unit 78 may be driven independently of the first driving unit 68, thereby independently moving the second end of the X axis transfer mechanism so that the first end and the second end of the X axis transfer mechanism are not put in a horizontal line.

The first driving unit 68 and the second driving unit 78 may be arranged to drive in a dual servo mode. The first driving unit 68 and the second driving unit 78 may also be arranged to drive independently. An embodiment using this method will be described with reference to FIG. 3. The first Y axis transfer mechanism 60 comprises a first Y axis frame 61, a first ball screw 62 mounted to the first Y axis frame 61 to extend in the Y axis direction, and a first LM guide (linear motion guide) 64 arranged in parallel with the first ball screw 62. In an embodiment, the first driving unit 68, e.g., a servo motor, is provided to one end of the first ball screw 62 and drives the first ball screw 62.

The second Y axis transfer mechanism 70, which is arranged parallel to the first Y axis transfer mechanism 60, comprises the second Y axis frame 71 and a second ball screw 72 extended in the Y axis direction to the second Y axis frame 71, and a second LM guide 74 arranged in parallel with the second ball screw 72. In an embodiment, the second driving unit 78 such as a servo motor is provided to one end of the second ball screw 72 and drives the second ball screw 72.

The number of third ball screws 82 that are provided to the X axis transfer mechanism 80 is the same as the number of the head unit 50 mounted to the X axis frame 81. Further, the head units 50 may be mounted to a third LM guide 84 when they are arranged in different positions in the X axis direction.

The X axis transfer mechanism 80 is coupled to the first Y axis transfer mechanism 60 and the second Y axis transfer mechanism 70. Specifically, first and second carriers 66, 76, which are coupled to the first and second ball screws 62, 72 and are moved in the Y axis direction, are arranged in the first and second Y axis transfer mechanisms 60, 70. The X axis frame 81 in the X axis transfer mechanism 80 is coupled to the first and second carriers 66, 76.

In an embodiment, the first and second Y axis drive units 68, 78 may control the first and second Y axis transfer mechanism 60, 70 in a dual servo mode. The first and second Y axis drive units 68, 78 may drive independently the first Y axis transfer mechanism 60 and the second Y axis transfer mechanism 70, respectively. Thereby, both ends of the X axis transfer mechanism 80 are coupled perpendicularly to the first Y axis transfer mechanism 60 and the second Y axis transfer mechanism 70. The first and second Y axis transfer mechanisms 60, 70 move in the Y axis direction and may arrange the X axis transfer mechanism 80 to be inclined from the X axis, by independently driving the first ball screw 62 of the first Y axis transfer mechanism 60 or the second ball screw 72 of the second Y axis transfer mechanism 70.

It is preferable that the X axis transfer mechanism 80 and the first and second Y axis transfer mechanisms 60, 70 are coupled by rotation connection members 91, 92 for their relative rotation in between. For example, as shown in FIG. 3, an X axis frame 81 of the X axis transfer mechanism 80 and the first Y axis carrier 66 may be coupled by the first rotation connection member 91, and the X axis frame 81 and the second Y axis carrier 76 may be coupled by the second rotation connection member 92. In an embodiment, the first and second rotation connection members 91, 92 can be adaptation elements for a minute elastic displacement or rotation joints to enable a relative rotation between the first and second Y axis carriers 60, 70 and the X axis frame 81. In an embodiment, the first and second rotation connection members 91, 92 are included to minimize a torsional stress of the X axis transfer mechanism having a fixed length.

The head unit 50 is moved horizontally by the first and second Y axis transfer mechanisms 60, 70 and the X axis transfer mechanism 80. The first and second Y axis transfer mechanisms 60, 70 are mounted to the bed 20 in parallel with the Y axis. The X axis transfer mechanism 80 is in parallel with the conveyor 40 and is mounted to the first and second Y axis transfer mechanisms 60, 70 to move along the Y axis. A plurality of head units 50 are provided to the X axis transfer mechanism 80, and the head units 50 are mounted to the X axis transfer mechanism 80 and are movable independently in the X axis direction.

It is preferable that a plurality of head units 50 descend at the same time and the nozzles 52 which are provided to each head unit 50 mount the electronic components at the same time in order to increase the mounting speed of the component mounter 10. For this reason, at least two PCBs P corresponding one to one with one head unit 50 may be positioned at the conveyor 40.

Figure 4:
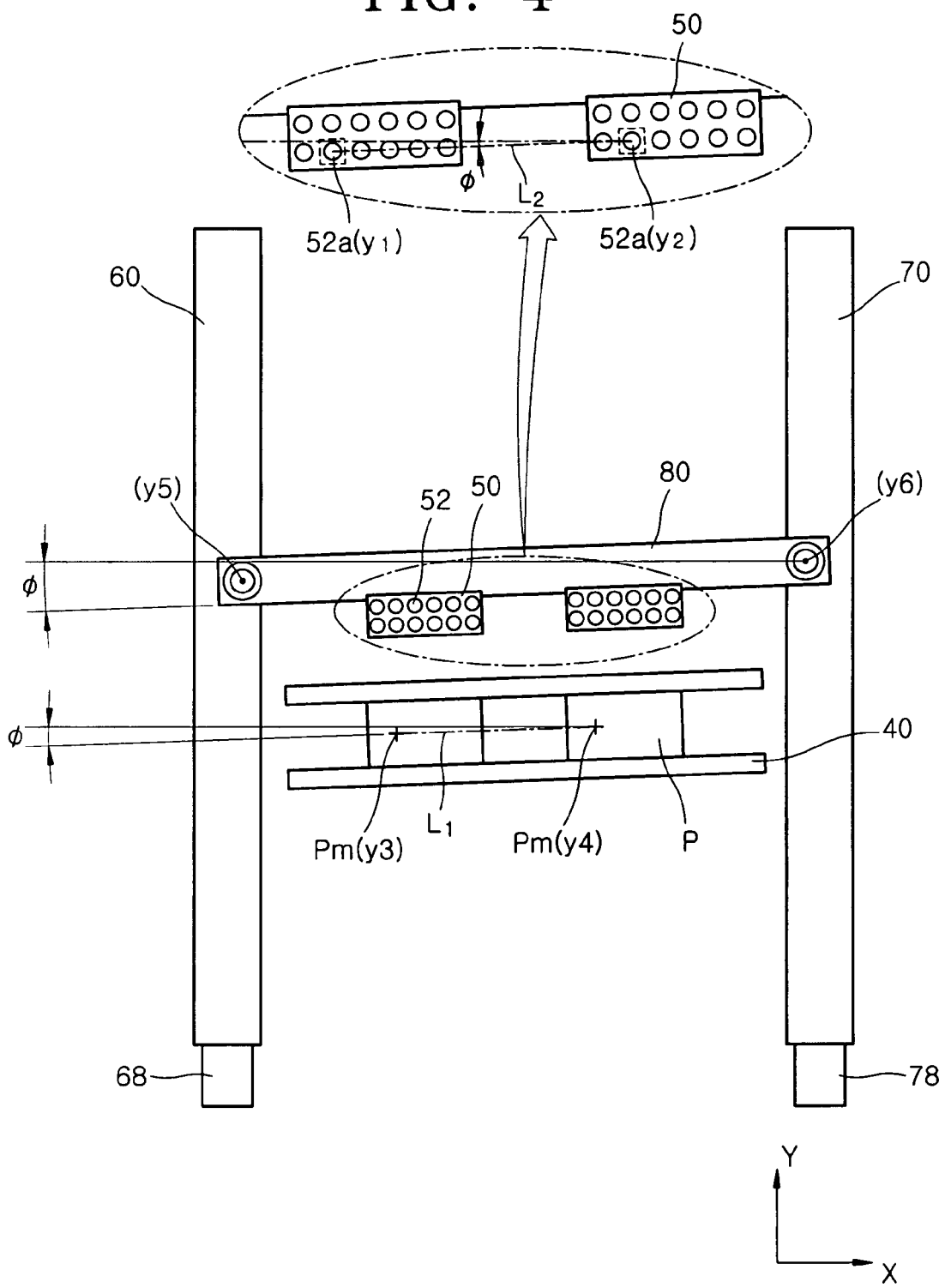
FIG. 4 is a diagram schematically illustrating an embodiment of the first and second Y axis transfer mechanisms and the X axis transfer mechanism shown in FIG. 2.
Figure 5:
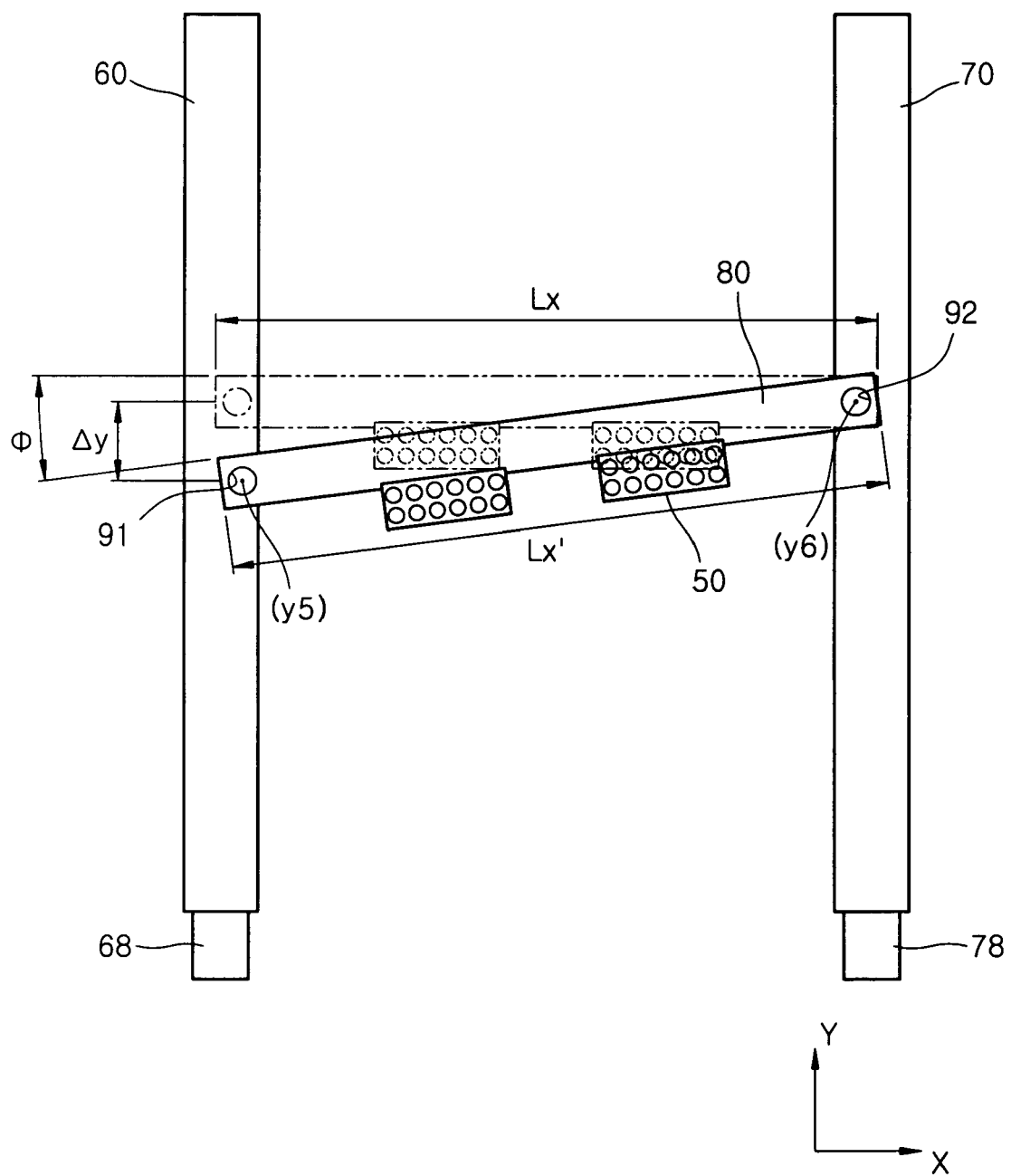
FIG. 5 is a diagram schematically illustrating an inclination degree of the X axis transfer mechanism in the component mounter shown in FIG. 2.

In an embodiment, as shown in FIGS. 4 and 5, a Y axis position value y5 of the first end of the X axis transfer mechanism 80 may be different from a Y axis position value y6 of the second end of the X axis transfer mechanism 80. That is, the conveyor 40 might not be arranged parallel to the X axis due to an assembly tolerance generated when the conveyor 40 is coupled to the bed 20, and the X axis transfer mechanism 80 might not be positioned parallel to the conveyor 40 when the PCB P moves on the conveyor 40.

Therefore, in the present invention, it may be necessary to change the position value of the nozzles 52 that absorb the electronic components depending on a position value of a specified mounting position. For this reason, the second driving unit 78 is provided, in addition to the first driving unit 68. The second driving unit 78 allows the X axis transfer mechanism 80 to be inclined relative to the X axis so that a first imaginary line L1, formed on a plurality of PCBs, connecting mounting points Pm corresponding to specified mounting positions of the electronic components is parallel to a second imaginary line connecting the nozzles 52a that absorb the electronic components C to be mounted to the specified mounting positions. Here a mounting point Pm represents the mounting position of each component on a PCB or PCBs. Information of mounting points Pm are generally inputted and saved to the component mounter as CAD data of the working PCB. Therefore, when different components are mounted on different PCBs at the same time, or when different components are mounted on a PCB at the same time, it is easy to find the inclination degree of mounting positions by determining whether the first imaginary line L1 connecting mounting points is parallel to the second line L2.

Specifically, the Y axis position values y3, y4 of a fiducial mark Pm of a plurality of PCB P mounted to the conveyor 40 may be different from each other because (i) the conveyor 40 is inclined by a predetermined angle $\phi$ from the X axis or (ii) the Y axis position values y3, y4 of a plurality of PCB P may be different from each other because one PCB P slantingly reaches the conveyor.

Therefore, in the present invention, the Y axis position values y1, y2 of the nozzles 52a of the head units 50 corresponding to the PCBs are the same as the Y axis position values y3, y4 of the PCB P because the X axis transfer mechanism 80 is also inclined by the same angle $\phi$ as a line connecting the mounting points Pm of the PCB from the X axis.

That is, it is possible to simply amend a position of the head unit without adding axes in response to the PCB arranged in a different X position of the conveyor due to an assembling tolerance value of the conveyor 40 and/or a mounting tolerance value for the PCB P on the conveyor 40 by twisting the X axis transfer mechanism 80 a little from the X axis without changing its length.

On the other hand, the component mounter 10 may absorb at the same time a plurality of electronic components C that is arranged on the component supply unit 30. In an embodiment, the X axis transfer mechanism 80 may also be inclined by the same angle in which the electronic components C on the component supply unit 30 are inclined from the X axis because the second driving unit 78 moves the second end of the X axis transfer mechanism in the y axis direction by driving independently of the first driving unit 68.

In the present invention, it is possible to generate an angle $\phi$ different from a right angle relative to the Y axis without a length change in the X axis direction. That is, as shown in FIG. 5, if a length Lx of the X axis transfer mechanism 80 is supposed to be 1000 mm and a maximum difference $\Delta y$ between y5 and y6 required to compensate for a difference of Y values of mounting points on two PCBs is supposed to 2 mm, a difference (Lx'−Lx, $\Delta L$) from a changed length Lx' of the X axis transfer mechanism 80 to an original length Lx of the X axis transfer mechanism 80 is about 2 μm as can be seen from an equation Lx'=Sqrt (Lx$^2$+$\Delta y^2$). Therefore, an additional force Fs required of the first and second Y axis drive unit 68, 78 to endure for a length change $\Delta L$ in the X axis direction of the X axis transfer mechanism 80 is about 1.198 N, as can be seen from equations F=(A×E×$\Delta L$)/Lx and F×$\Delta L$=Fs×$\Delta y$. In the equations, about 8681 mm$^2$ is substituted for A as a sectional area of the X axis transfer mechanism 80, and 69×10$^3$ N/mm$^2$ is substituted for E as an elastic modulus.

The additional force of about 1.198N as in an embodiment does not deteriorate a control performance of the first and second Y axis drive units 68, 78. Therefore, it is possible to generate angle $\phi$ greater than a right angle relative to the Y axis without a length change of the X axis.

According to an embodiment of the present invention, it is possible to adjust a position of the head unit 50, depending on an assembling tolerance of the conveyor 40 and a mounting tolerance of a PCB P by utilizing the first and second Y axis drive units 68, 78 without increasing the number of separate axes such as the conveyor 40. Therefore, it is possible to descend the nozzles 52 at the same time in two or more head units 50, and mount the electronic components C to the PCB P, thus reducing material costs.

Further, it is possible to increase position accuracy of the head unit 50 by controlling only its position in order to arrange the head unit 50 depending on a twist position of the PCB P.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for mounting components, the apparatus comprising:
    a primary axis transfer mechanism, the primary axis transfer mechanism having a first end and a second end;
    at least one head unit coupled to the primary axis transfer mechanism;
    a first secondary axis transfer mechanism coupled to the first end of the primary axis transfer mechanism;
    a second secondary axis transfer mechanism coupled to the second end of the primary axis transfer mechanism; and
    a drive unit for moving the primary axis transfer mechanism along a secondary axis, wherein the drive unit is coupled to a pivot mechanism that pivots the primary axis transfer mechanism so that the drive unit can move one of the first end and the second end of the primary axis transfer mechanism a further distance along the secondary axis than the other end.

2. The apparatus of claim 1, wherein the primary axis is an X axis and the secondary axis is a Y axis.

3. The apparatus of claim 1, wherein the drive unit comprises:
    a first drive unit coupled to the first secondary transfer mechanism for moving the first end of the primary axis transfer mechanism; and
    a second drive unit coupled to the second secondary transfer mechanism for moving the second end of the primary axis transfer mechanism.

4. The apparatus of claim 3, wherein the second drive unit interlocks with the first drive unit, thereby causing the first drive unit to drive the second drive unit.

5. The apparatus of claim 3, further comprising:
    a first ball screw arranged along the secondary axis, wherein the first ball screw is coupled to the first drive unit and to the first end of the primary axis transfer mechanism; and
    a second ball screw arranged along the secondary axis, wherein the second ball screw is coupled to the second drive unit and to the second end of the primary axis transfer mechanism.

6. The apparatus of claim 3, wherein the second drive unit controls the second end of the primary axis transfer mechanism to move along the secondary axis to a position where a first line connecting mounting points that correspond to specific component mounting positions on a mounting surface is parallel to a second line connecting a plurality of head units comprising nozzles for placing the components on the mounting surface.

7. The apparatus of claim 1, further comprising a head unit driver coupled to the head unit for moving the head unit along the primary axis.

8. The apparatus of claim 1, further comprising:
    a first rotation connection member for coupling the first secondary axis transfer mechanism to the first end of the primary axis transfer mechanism; and
    a second rotation connection member for coupling the second secondary axis transfer mechanism to the second end of the primary axis transfer mechanism.

* * * * *